United States Patent
Zheng

(10) Patent No.: US 8,179,712 B2
(45) Date of Patent: May 15, 2012

(54) NON-VOLATILE MEMORY WITH METAL-POLYMER BI-LAYER

(75) Inventor: Jun Zheng, Edina, MN (US)

(73) Assignee: Seagate Technology LLC, Scotts Valley, CA (US)

(*) Notice: Subject to any disclaimer, the term of this patent is extended or adjusted under 35 U.S.C. 154(b) by 225 days.

(21) Appl. No.: 12/491,367

(22) Filed: Jun. 25, 2009

(65) Prior Publication Data

US 2010/0103716 A1    Apr. 29, 2010

Related U.S. Application Data

(60) Provisional application No. 61/109,199, filed on Oct. 29, 2008.

(51) Int. Cl.
*G11C 11/00* (2006.01)
*G11C 7/00* (2006.01)
*H01L 47/00* (2006.01)

(52) U.S. Cl. . 365/148; 365/189.16; 257/2; 257/E47.001

(58) Field of Classification Search .......... 365/148, 365/153, 185.18, 185.26; 257/2, 529, 40
See application file for complete search history.

(56) References Cited

U.S. PATENT DOCUMENTS

| | | | |
|---|---|---|---|
| 7,465,983 B2 | 12/2008 | Eldridge et al. | |
| 7,482,630 B2 | 1/2009 | Lindsay | |
| 2005/0270442 A1* | 12/2005 | Yang et al. | 349/86 |
| 2008/0101121 A1* | 5/2008 | Kreupl | 365/185.14 |

OTHER PUBLICATIONS

Lauters et al., "Multilevel conductance switching in polymer films" Applied Physics Letters, vol. 89, 013507 (2006).
Lauters et al., "Nonvolatile multilevel conductance and memory effects in organic thin films" Applied Physics Letters, vol. 87, 231105 (205).
Ma et al., "Organic nonvolatile memory by controlling the dynamic copper-ion concentration within organic layer" Applied Physics Letters, vol. 84, No. 24 (Jun. 2004).
Sakai et al., "Highly Scalable Fe(Ferroelectric)-NAND Cell with MFIS(Metal-Ferroelectric-Insulator-Semiconductor) Structure for Sub-10nm Tera-Bit Capacity NAND Flash Memories" IEEE, pp. 103-105 (2008).

* cited by examiner

*Primary Examiner* — Alexander Sofocleous
*Assistant Examiner* — Hai Pham
(74) *Attorney, Agent, or Firm* — Mueting, Raasch & Gebhardt, PA

(57) ABSTRACT

A resistive memory cell that includes a metal-polymer bi-layer proximate a CMOS gate. The memory cell has a substrate having a source contact connected to a source line and a drain contact connected to a drain line, a CMOS gate proximate the substrate electrically connecting the source contact and the drain contact, the bi-layer adjacent the CMOS gate, the bi-layer comprising a thin metal layer and a polymer layer, and a word line connected to the bi-layer.

14 Claims, 2 Drawing Sheets

NON-VOLATILE MEMORY WITH METAL-POLYMER BI-LAYER

RELATED APPLICATION

This application claims priority to U.S. provisional patent application No. 61/109,199, filed on Oct. 29, 2008 and titled "Novel Non-Volatile Memory in NAND Architecture Through Metal-Polymer Bi-Layer". The entire disclosure of application No. 61/109,199 is incorporated herein by reference.

BACKGROUND

Fast growth of the pervasive computing and handheld/communication industry has generated exploding demand for high capacity non-volatile solid-state data storage devices. Current technology like flash memory, that utilizes a floating gate from which electrons tunnel, has several drawbacks such as slow access speed, limited endurance, and the integration difficulty. Flash memory (NAND or NOR) also faces significant scaling problems.

Resistive sense memories are promising candidates for future non-volatile and universal memory by storing data bits as either a high or low resistance state. One such memory, MRAM, features non-volatility, fast writing/reading speed, almost unlimited programming endurance and zero standby power. The basic component of MRAM is a magnetic tunneling junction (MTJ). MRAM switches the MTJ resistance by using a current induced magnetic field to switch the magnetization of the MTJ. As the MTJ size shrinks, the switching magnetic field amplitude increases and the switching variation becomes more severe. Resistive RAM (RRAM) is another resistive sense memory that has a variable resistance layer that can switch between a high resistance state and a low resistance state (for example by the presence or absence of a conductive filament) by application of a current or voltage.

However, many yield-limiting factors must be overcome before resistive sense memory enters the production stage. Improvements in resistive sense memory are always welcome.

BRIEF SUMMARY

The present disclosure relates to non-volatile memory devices for NAND architecture. The resistive sense memory device includes a transistor having a CMOS gate and a metal-polymer bi-layer. Under current, ions from the metal diffuse into and out from the polymer, changing the resistance of the bi-layer and of the memory device.

One particular embodiment of this disclosure is a resistive memory cell. The memory cell has a substrate having a source contact connected to a source line and a drain contact connected to a drain line, and a CMOS gate proximate the substrate electrically connecting the source contact and the drain contact. A bi-layer element is adjacent the CMOS gate, the bi-layer comprising a thin metal layer and a polymer layer, with a word line connected to the bi-layer.

Another particular embodiment of this disclosure is a method of writing to a resistive memory cell, the cell having a gate structure comprising a CMOS gate, a polymer layer proximate the CMOS gate, and a thin metal layer adjacent the polymer layer. The method includes passing a voltage through the gate structure to drive metal ions from the metal layer into the polymer layer, and passing an opposite voltage through the gate structure to return metal ions to the metal layer from the polymer layer. When metal ions are present in the polymer layer, the memory cell has a low resistance and a first data state, and when metal ions are not present in the polymer layer, the memory cell has a high resistance and a second data state.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. Any definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to non-volatile memory devices that utilize a standard CMOS gate in conjunction with a metal-polymer bi-layer to form a non-volatile memory device. The memory device has a longer working life, faster writing speed, and higher data storage density than other memory devices, particularly standard CMOS memory. The memory device is particularly suited for NAND memory. While the present disclosure is not so limited, an appreciation of various aspects of the disclosure will be gained through a discussion of the examples provided below.

Figure 1:
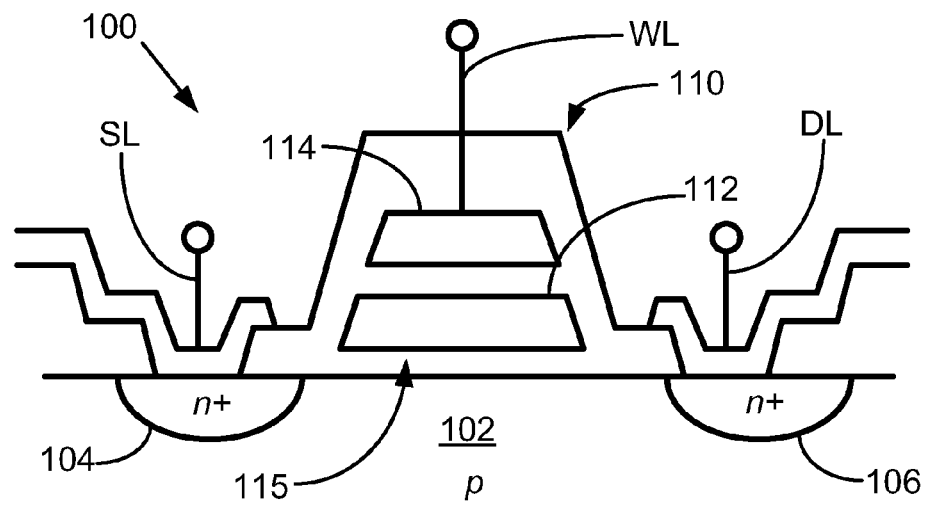
FIG. 1 is a schematic side view of an illustrative flash memory device.

FIG. 1 is a schematic diagram of an illustrative memory, in particular, a NAND flash memory device that has a floating gate for data storage. In particular, memory cell 100 has a substrate 102 (in this embodiment, composed of p-doped silicon) with a source contact 104 and a drain contact 106 (in this embodiment, each composed of n-doped silicon). Electrically connected to source contact 104 is a source line SL and electrically connected to drain contact 106 is a drain line DL. Memory cell 100 includes a gate 110 that includes both a floating gate 112 and a control gate 114, both encased within a tunnel oxide barrier 115. Gate 110 is electrically connected to a word line WL.

For memory cell 100, the electrons, stored in floating gate 112 as data information, travel through the thin gate oxide layer 115 proximate substrate 102 to either source contact 104 or drain contact 106 by tunneling or hot carrier injection. Over time, this process degrades oxide barrier 115 between floating gate 112 and substrate 102 and contacts 104, 106. Because gate oxide barrier 115 is critical to the operation of memory cell 100, in particular the memory reading process, memory cell 100 will be non-readable after a certain amount of writing processes. Because of this degradation of oxide barrier 115, most flash memory cells 100 can be written no more than about 1 million times.

Additionally, writing currents are limited to minimize damage to gate oxide barrier 115, which in turn limits the writing speed to memory cell 100. In an attempt to reduce the oxide degradation issue, memory cell 100 includes control gate 114 to store the charge from floating gate 112. Because of the second gate 114, the overall size and footprint of memory cell 100 is difficult to reduce, when attempting to increase memory density.

In NAND flash memory arrays, a plurality of memory cells 100 are connected in series, which prevents cells 100 from being read and programmed individually; that is, cells 100 connected in series must be read in series. The requirement to read and write to cells 100 serially rather than individually decreases the read and write speeds of NAND flash memory arrays.

Figure 2:
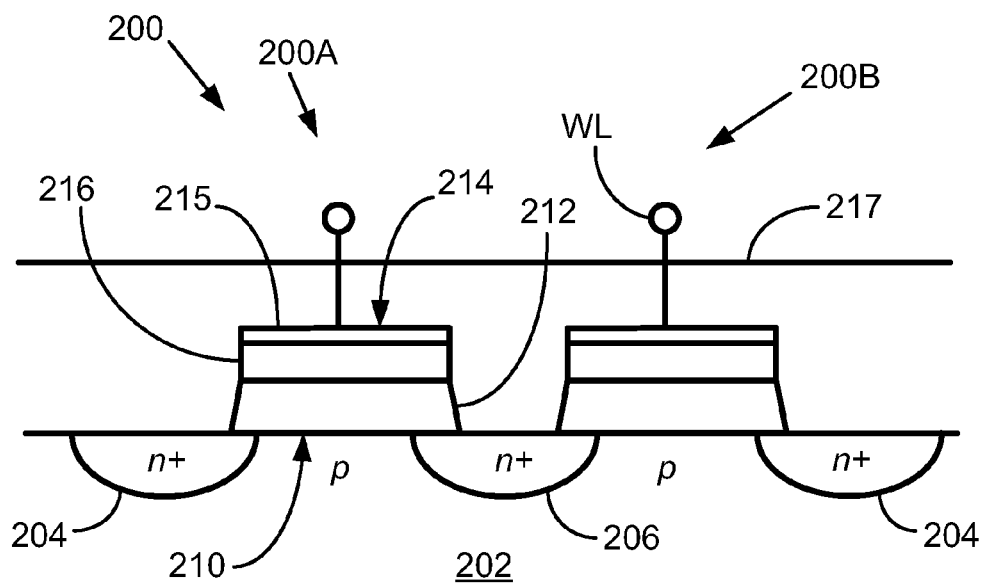
FIG. 2 is a schematic side view of a non-volatile memory device having a metal-polymer bi-layer.

To overcome the common problems associated with memory cell 100 discussed above, an alternate memory device, having a bi-layer composite material in place of the floating gate and the control gate, is illustrated in FIG. 2. Referring to FIG. 2, a metal-polymer bi-layer layer is provided in a generally complementary metal-oxide-semiconductor (CMOS) memory cell 200. FIG. 2 illustrates two adjacent memory cells 200, specifically memory cell 200A and memory cell 200B. Memory cells 200A, 200B are identical to each other, thus, elements and features of one cell (e.g., cell 200A) are the same in the other cell (e.g., cell 200B) and vice versa.

Memory cell 200 (i.e., either and both of memory cell 200A and cell 200B) has a substrate 202 (in this embodiment, composed of p-doped silicon) with a source contact 204 and a drain contact 206 (in this embodiment, each composed of n-doped silicon). Electrically connected to source contact 204 is a source line (not illustrated) and electrically connected to drain contact 206 is a drain line (not illustrated). Memory cell 200 includes a gate structure 210 bridging source contact 204 and drain contact 206. Gate structure 210 is composed of a CMOS gate 212 and a bi-layer 214, both encased within a dielectric insulating material 217. In some embodiments, CMOS gate 212 is a polysilicon gate. Gate structure 210 is configured so that during a data writing processes, current and electrons do not pass through substrate 202 or dielectric insulation material 217, thus avoiding degradation of those materials. CMOS gate 212 and bi-layer 214 are electrically connected to a word line WL.

Bi-layer 214, adjacent to CMOS gate 212 in some embodiments with no intervening layers, is composed of a thin metal layer 215 and a polymer layer 216 in intimate contact with metal layer 215. In some embodiments, an intermediate layer, such as a metal or conducting layer, may be present between CMOS gate 212 and bi-layer 214. Polymer layer 216 is positioned between CMOS gate 212 and metal layer 215. Thin metal layer 215 has a thickness of no more than about 1000 nm, often about 50 nm to 200 nm. Examples of suitable materials for thin metal layer 215 include platinum (Pt), copper (Cu), titanium (Ti), tungsten (W), aluminum (Al), gold (Au), and chromium (Cr). Polymer layer 216 is preferably formed of an organic polymer material, having low conductivity, good film formability and stability. Poly[2-methoxy-5-(2'-ethyl-hexyloxy)-1,4-phenylene vinylene] (MEH-PPV) is one suitable material for polymer layer 216. Other suitable materials for polymer layer 216 include 2-amino-4,5-imidazoledicarbonitrile (AIDCN), tris-8-(hydroxyquinoline) aluminum ($Alq_3$), and zinc 2,9,16,23-tetra-tert-butyl-29H,31H-phthalocyanine (ZnPc). The thickness of polymer layer 216 may be about 50 to 200 nm, e.g., about 100 nm. In some embodiments, a buffer layer may be present between metal layer 215 and polymer layer 216. Examples of materials for a buffer layer are aluminum oxide ($Al_2O_3$) and lithium fluoride (LiF) at a thickness of about 4 nm.

During manufacture of bi-layer 214 and cell 200, as metal layer 215 is deposited on to polymer layer 216, metal ions penetrate into polymer layer 216, due to the porous nature of the polymer structure. In operation, when a sufficiently high voltage is applied to this bi-layer structure, the metal ions will tunnel further into polymer layer 216, thus changing the resistance and conductance of bi-layer 214.

Bi-layer 214 and thus memory cell 200 have at least two distinct non-volatile conductance states, a high conductance state (or low resistance state) and a low conductance state (or high resistance state), due to the diffusion of metal ions from metal layer 215 into and out from polymer layer 216. These two states correlate to two data states of bi-layer 214 and thus memory cell 200. For example, when bi-layer 214 is its high conductance state or low resistance state, this may be referred to as "0" data state, and when bi-layer 214 is in its low conductance state or high resistance state, this may be referred to as "1" data state. In other embodiments, when bi-layer 214 is its high conductance state or low resistance state, this may be referred to as "1" data state, and when bi-layer 214 is in its low conductance state or high resistance state, this may be referred to as "0" data state.

In general, bi-layer 214 exhibits very high resistance in both its high and low conductance states. The electrical conductivity of the high state and low state of bi-layer 214 can differ, for example, by five or six orders of magnitude. For example, a 100 nm×100 nm bi-layer 214 will have several mega ohms ($10^6 \Omega$) resistance in the low conductance state and several tera ohms ($10^{12} \Omega$) resistance in the high conductance state, both which are considered fairly high. In the high conductance state, bi-layer 214 functions as a capacitor, whereas in the low conductance state, bi-layer 214 functions as a resistor. In some embodiments, bi-layer 214 functions as a variable capacitor.

Figure 3:
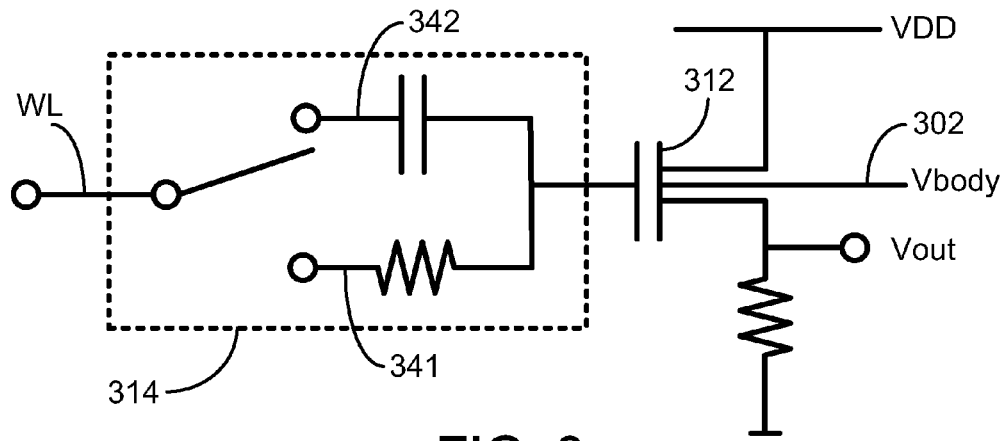
FIG. 3 is a circuit diagram of a memory device having a metal-polymer bi-layer.

FIG. 3 is the circuit schematic of memory device 200 of FIG. 2. Bi-layer 214 is represented by element 314 in FIG. 3, CMOS gate 212 is represented by element 312, substrate 202 is represented by element 302. Word line WL of FIG. 2 is likewise represented in FIG. 3. As indicated above, when bi-layer 314 is in its low conductance state, it functions as a resistor, represented as 341 whereas when bi-layer 314 is in its high conductance state, it functions as a capacitor, represented as 342.

When bi-layer 314 is resistor 341, any voltage applied to word line WL will go directly to CMOS gate 312. When bi-layer 314 is capacitor 342, any voltage (e.g., $V_H$) applied to word line WL will be shared by capacitor 342 and CMOS gate 312.

Returning to FIG. 2, memory cell 200 is configured for the passage of at least three distinct voltages therethrough, a threshold voltage ($V_{TH}$) to turn memory cell 200 ON, a high voltage ($V_H$) to switch bi-layer 214 between its capacitor and resistor states, and a very high voltage ($V_{VH}$) to drive metal ions from metal layer 215 in and out from polymer layer 216 to change the resistance of bi-layer 214 and thus the data state of memory cell 200. The high voltage ($V_H$), in general, turns on CMOS gate 312, no matter what is the state of bi-layer 314. Metal ions may move in and out from polymer layer 216 at both the capacitor and resistor states.

Prior to the exposure to any voltage, memory cell 200 is in its low conductance (OFF) state with little or no metal ions from metal layer 215 present in polymer layer 216. With passage of a threshold voltage ($V_{TH}$), usually about 0.5-0.7 V, from word line WL, memory cell 200 switches from the OFF state to its ON state, allowing current or electron flow from either source contact 204 or drain contact 206 through gate structure 210. As this point, gate structure 210 is in its capacitance state and having no metal ions from metal layer 215 present in polymer layer 216.

When in the ON state, with bi-layer 214 as a capacitor, in some embodiments, electrons pass from word line WL through bi-layer 214 and CMOS gate 212 to drain contact 206. In other embodiments, electrons pass from source contact 204 through CMOS gate 212 and bi-layer 214 to word line WL. There is no need for electrons to travel through a gate oxide material by tunneling or hot carrier injection and thus, there is little or no degradation between CMOS gate 212 and substrate 202 and contacts 204, 206. When in the OFF state, bi-layer 214 functions as a resistor, inhibiting the flow of electrons.

Upon application of $V_H$ after memory cell is ON, gate structure 210 switches from its resistance state to its capacitance state (i.e., from resistor 341 of FIG. 3 to capacitor 342) and vice versa. Subsequent application of $V_H$ switches gate structure 210 from its capacitance state to its resistive state (i.e., capacitor 342 to resistor 341), and back and forth.

Switching of the resistive versus capacitive state of gate structure 210 will occur at voltages between $V_H$ and $V_{VH}$.

A very high voltage ($V_{VH}$), higher than $V_H$ and, for example about 2 V, will cause diffusion of metal ions from metal layer 215 into and out from polymer layer 216. When metal ions are present in polymer layer 216, polymer layer 216 has a low resistance and memory cell 200 has a first data state (e.g., "0"). When metal ions are not present in polymer layer 216, polymer layer 216 has a high resistance and memory cell 200 has a second data state (e.g., "1"). The data state will not be affected by the capacitance state of bi-layer 214.

Memory cell 200, with bi-layer 214, is a desirable construction due to, for example, its high noise immunity and low static power consumption. Large amounts of power (e.g., 0.5-0.7V for $V_{TH}$, about 1-3 V for $V_H$, or about 5-10 V for $V_{VH}$) are required by cell 200 only when memory cell 200 is switching states (to ON, between capacitance versus resistive states, and between data states).

Further, the simplicity of CMOS gate 212 allows a high density of memory cells 200 and thus logic functions on a chip. Memory cell 200 is particularly suited for incorporation with a plurality of memory cells 200 in NAND architecture. Use of bi-layer 214 allows a NAND architecture in memory design which has the highest density in today's technology.

Figure 4:
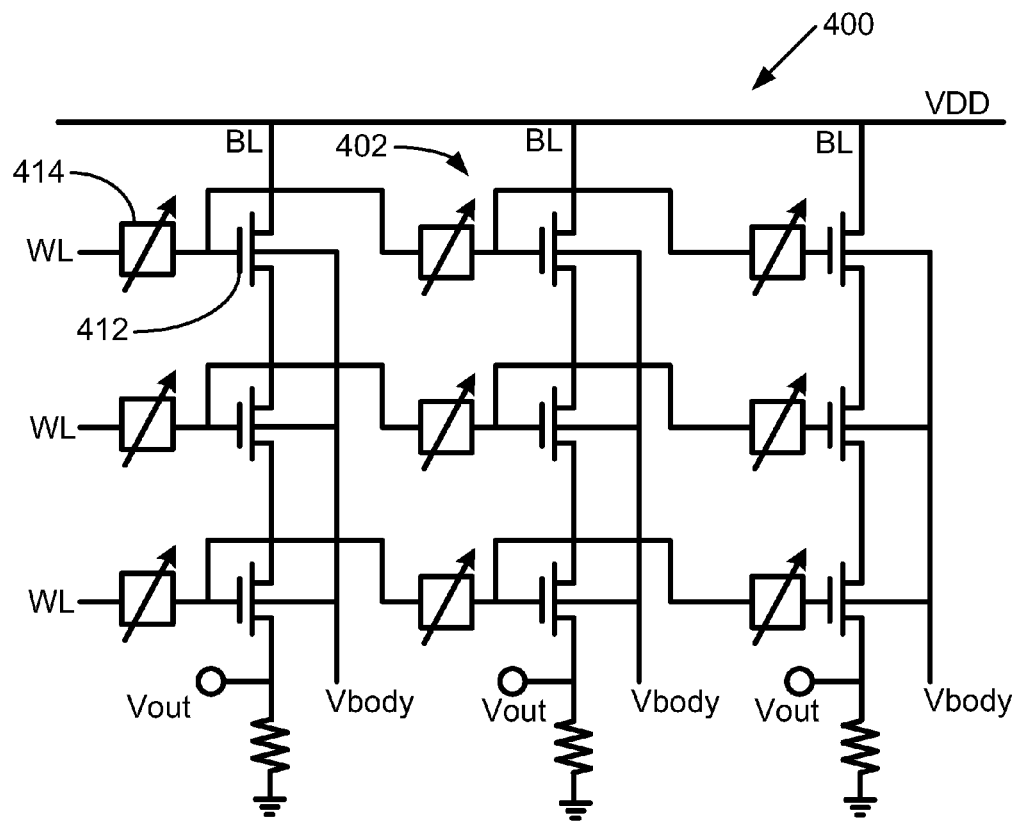
FIG. 4 is partial circuit diagram of NAND memory architecture utilizing memory cells having metal-polymer bi-layers.

FIG. 4 illustrates a partial NAND architecture schematic, showing a 3×3 array of memory cells incorporating a metal-polymer bi-layer. Memory array 400 has a plurality of identical memory cells 402, thus, elements and features of one cell are the same in the other cells. Each cell 402 has a CMOS gate 412 and a bi-layer structure 414, which together form a gate structure (similar to gate structure 210 of FIG. 2). Memory cells 402 in a column are electrically connected by a bit line BL and memory cells 402 in a row are electrically connected by word line WL.

Referring to FIG. 4 and to FIG. 2 for details, to write to a specific memory cell 402, either a "0" or "1" data bit, a very high bias voltage ($V_{VH}$) is applied to the respective word line WL and substrate 202 is grounded; the grounded substrate is represented by "Vbody" in FIG. 4. The respective bit line BL is also activated, via voltage. Depending on the voltage and thus direction of current in word line WL, metal ions will either flow from metal layer 215 into polymer layer 216, thus creating the low resistance data state, or will flow from polymer layer 216 back to metal layer 215, thus creating the high resistance data state, which is stored by bi-layer structure 214/414.

To read from a desired memory cell 402, all memory cells 402 are exposed to a high voltage bias ($V_H$) via their word line WL except for the desired memory cell 402, which is has its word line WL set to the threshold voltage ($V_{TH}$). Each bit line BL is also activated. The Vout for the respective bit line BL is measured. Knowing that the undesired memory cells 402 have only the threshold voltage ($V_{TH}$), the voltage of the desired memory cell 402 can be determined.

In some embodiments, a metal-polymer bi-layer memory cell may be configured for multi-bit data storage capability when used with NAND architecture. Since the bi-layer capacitor (i.e., CMOS gate 212 of FIG. 2, CMOS gate 312 of FIG. 3, or CMOS gate 412 of FIG. 4) is controllable by applied voltage (e.g., $V_H$, $V_{VH}$) and pulse width, the transistor channel current can be controlled correspondingly. Different channel current levels, based on the presence of metal ions in polymer layer 216, can be interpreted as multi-bit information.

A memory cell (e.g., memory cell 200 or 402) having a metal-polymer bi-layer in conjunction with a gate, (e.g., bi-layer 214 with CMOS gate 202 of FIG. 2) has several advantages over traditional floating gate flash memory devices (e.g., memory cell 100 of FIG. 1). For example, the bi-layer memory cell has writing processes that do not pass current through and degrade a gate tunnel oxide, thus providing a longer lifetime for the memory cell than for memory cells with a floating gate. Additionally, the bi-layer memory cell has a long data retention time. Because metal ions have less mobility than electrons in a floating gate design, the bi-layer device will have longer data retention time than flash memory.

The process to form a bi-layer memory cell is compatible with current CMOS process technology and will also be compatible with future CMOS technology. From the process flow, only minimal and minor changes from traditional CMOS process technology are needed in order to form bi-layer memory cells. Thus, research and development (R&D) and fabrication costs will be similar to or lower than traditional flash memory devices. As CMOS technology keeps shrinking its size, high-k gate insulation material, such as HfO, is being used. For floating gate constructions, this results in a thicker tunneling oxide layer for electrons traveling in/out of floating gate. A bi-layer device, as per this disclosure, will not be impacted negatively by the increased thickness, in terms of performance and density.

Thus, embodiments of the NON-VOLATILE MEMORY WITH METAL-POLYMER BI-LAYER are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A resistive memory cell comprising:
   a substrate having a source contact connected to a source line and a drain contact connected to a drain line;
   a CMOS gate proximate the substrate electrically connecting the source contact and the drain contact;
   a bi-layer adjacent the CMOS gate, the bi-layer comprising a thin metal layer and a polymer layer; and
   a word line connected to the bi-layer.

2. The memory cell of claim 1 wherein the polymer layer comprises poly[2-methoxy-5-(2'-ethyl-hexyloxy)-1,4-phenylene vinylene] (MEH-PPV), 2-amino-4,5-imidazoledicarbonitrile (AIDCN), tris-8-(hydroxyquinoline) aluminum ($Alq_3$), or zinc 2,9,16,23-tetra-tert-butyl-29H,31H-phthalocyanine (ZnPc).

3. The memory cell of claim 2 wherein the polymer layer has a thickness of about 50 to 200 nm.

4. The memory cell of claim 1 wherein the metal layer has a thickness of no more than 2000 nm.

5. The memory cell of claim 4 wherein the metal layer has a thickness of about 50 nm to 200 nm.

6. The memory cell of claim 1 wherein the metal layer comprises platinum, copper or titanium.

7. The resistive memory cell of claim 1, wherein the polymer layer is positioned between the CMOS gate and the metal layer.

8. A resistive memory cell comprising:
   a substrate having a source contact connected to a source line and a drain contact connected to a drain line;
   a gate structure electrically connecting the source contact and the drain contact, the gate structure comprising a CMOS gate, a polymer layer proximate the CMOS gate, and a thin metal layer adjacent the polymer layer, the gate structure encased in dielectric insulation material; and
   a word line connected to the gate structure, wherein upon application of a voltage via the word line to the gate structure, metal ions from the thin metal layer move into the polymer layer, and upon application of an opposite voltage via the word line to the gate structure, metal ions return to the thin metal layer from the polymer layer.

9. The memory cell of claim 8 wherein the polymer layer comprises poly[2-methoxy-5-(2'-ethyl-hexyloxy)-1,4-phenylene vinylene] (MEH-PPV), 2-amino-4,5-imidazoledicarbonitrile (AIDCN), tris-8-(hydroxyquinoline) aluminum ($Alq_3$), or zinc 2,9,16,23-tetra-tert-butyl-29H,31H-phthalocyanine (ZnPc).

10. The memory cell of claim 9 wherein the polymer layer has a thickness of about 50 to 200 nm.

11. The memory cell of claim 8 wherein the metal layer has a thickness of no more than 1000 nm.

12. The memory cell of claim 11 wherein the metal layer has a thickness of about 50 nm to 200 nm.

13. The memory cell of claim 8 wherein the metal layer comprises platinum, copper or titanium.

14. The resistive memory cell of claim 8, wherein the polymer layer is positioned between the CMOS gate and the metal layer.

* * * * *